United States Patent
Ye et al.

(10) Patent No.: US 7,884,032 B2
(45) Date of Patent: Feb. 8, 2011

(54) THIN FILM DEPOSITION

(75) Inventors: Mengqi Ye, Santa Clara, CA (US);
Peijun Ding, Saratoga, CA (US);
Hougong Wang, Pleasanton, CA (US);
Zhendong Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1161 days.

(21) Appl. No.: 11/260,899

(22) Filed: Oct. 28, 2005

(65) Prior Publication Data
US 2007/0099438 A1    May 3, 2007

(51) Int. Cl.
*H01L 21/469* (2006.01)
(52) U.S. Cl. ............... 438/778; 257/E21.169; 257/E21.17; 257/E21.191; 257/E21.269; 257/E21.477; 438/585; 438/761; 438/790
(58) Field of Classification Search .......... 257/E21.169, 257/E21.17, E21.191, E21.269, E21.477; 438/585, 761, 778, 790
See application file for complete search history.

(56) References Cited

U.S. PATENT DOCUMENTS

| | | | |
|---|---|---|---|
| 5,186,718 | A | 2/1993 | Tepman et al. |
| 5,536,330 | A | 7/1996 | Chen et al. |
| 5,736,021 | A | 4/1998 | Ding et al. |
| 5,759,287 | A | 6/1998 | Chen et al. |
| 6,258,707 | B1 * | 7/2001 | Uzoh .................... 438/618 |
| 6,277,722 | B1 * | 8/2001 | Lee et al. .............. 438/592 |
| 6,413,382 | B1 | 7/2002 | Wang et al. |
| 6,503,050 | B2 | 1/2003 | Reimer et al. |
| 6,538,327 | B1 * | 3/2003 | Lopatin et al. ............ 257/758 |
| 6,833,161 | B2 | 12/2004 | Wang et al. |
| 6,916,398 | B2 | 7/2005 | Chen et al. |
| 6,946,408 | B2 | 9/2005 | Le et al. |
| 7,141,186 | B2 * | 11/2006 | Abe et al. ............. 252/520.2 |
| 2003/0121608 | A1 | 7/2003 | Chen et al. |
| 2003/0224217 | A1 | 12/2003 | Byun et al. |

OTHER PUBLICATIONS

Williams Advanced Materials, "MRAM Technology Reviews", [online], 2005, [retrieved Aug. 19, 2005], retrieved from the Internet at <URL: http://www.williams-adv.com/tools/mram-technology-review.php>, 2 pp.

(Continued)

*Primary Examiner*—Asok K Sarkar
(74) *Attorney, Agent, or Firm*—Konrad Raynes & Victor LLP (57) ABSTRACT

A system, method and apparatus is capable of producing layers of various materials stacked on one another on a substrate without exposing the substrate to the pressure and contaminants of ambient air until the stack is complete. In one aspect, the stack of layers can include both an insulative layer of one or more insulative films, and a conductive metal layer of one or more conductive metal layer films. In another aspect, a bias signal of positive and negative voltage pulses may be applied to a target of a deposition chamber to facilitate deposition of the target material in a suitable fashion. In yet another aspect, one or more of the deposition chambers may have associated therewith a pump which combines a turbomolecular pump and a cryogenic pump to generate an ultra high vacuum in that chamber. Other features are described and claimed.

27 Claims, 8 Drawing Sheets

OTHER PUBLICATIONS

Applied Materials, Inc., "Applied Centura Gate Stack", [online], 2005 [retrieved on Aug. 3, 2005], retrieved from the Internet at <URL: http://www.appliedmaterials.com/products/fep_centura-dpn.html>, 5 pp.

Applied Materials, Inc., "Applied Materials Product Overview 2005-Dielectric Deposition", retrieved prior to Oct. 28, 2005, 11 pp.

Applied Materials, Inc., "Applied Producer Dielectric Etch", [online], 2005, [retrieved on Aug. 3, 2005], retrieved from the Internet at <URL: http://www.appliedmaterials.com/products/producer_etch.html>, 2 pp.

Lek, C.M., B.J. Cho, C.H.Ang, S.S. Tan, W.Y. Loh, J.Z. Zhen, and C. Lap, "Impact of Decoupled Plasma Nitridation of Ultra-Thin Gate Oxide on the Performance of P-Channel MOSFETs", Letter to the Editor, Semiconductor Science and Technology, No. 17, May 17, 2002, 4 pp.

Nano-tsunami.com, "Applied Materials and IMEC Collaborate to Develop 45nm Transistor Technologies", [online] Jan. 13, 2005, [retrieved on Aug. 3, 2005], retrieved from the Internet at <URL: http://www.voyle.net/Nano%20Electronics%202005/Nano%20Electronics-2005-0002.htm>, 3 pp.

\* cited by examiner

THIN FILM DEPOSITION

BACKGROUND

Figure 1:
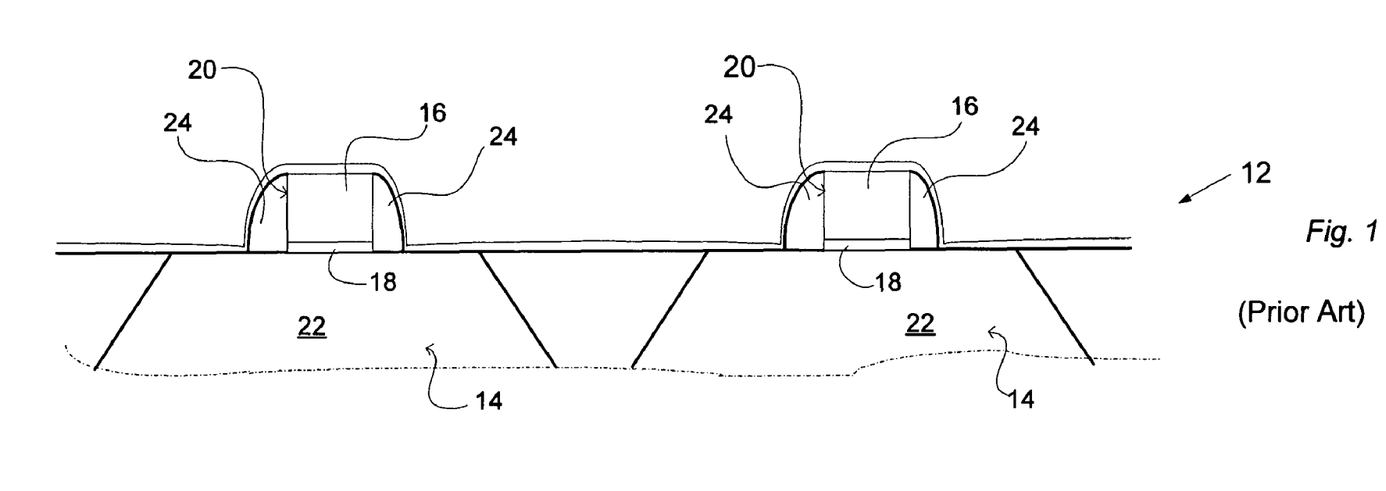
FIG. 1 is a partial cross-sectional view of a CMOS structure of an integrated circuit device, as practiced in the prior art.

FIG. 1 shows a CMOS semiconductor device 12 which includes a plurality of transistor structures, an example of which is indicated generally at 14. Each transistor structure 14 includes a gate 16 which is deposited on an insulation layer 18. The gate 16 and the insulation layer 18 form a gate stack 20 overlying a silicon region 22. The gate stack 20 is formed in a dielectric layer 24. Each silicon region 20 is doped as appropriate to form the desired array of p-type and n-type channel transistors.

The insulation layer 18 may be formed of a variety of insulative materials including silicon dioxide and $HfSiO_x$, depending upon the particular application. Such insulative layers may be deposited on a wafer using various tools including chemical vapor deposition (CVD) chambers which deposit an insulative film by introducing one or more deposition gasses into a chamber. Insulative films may be deposited using other tools such as physical vapor deposition (PVD) chambers which sputter a target to dislodge material from the target and deposit it on the wafer. The sputtered target material may be deposited in a pure form from the target or may react with various working gasses such as oxygen, for example, introduced into the chamber to deposit a reaction compound on the wafer.

To provide certain properties to the insulation film, the deposited insulation layer may undergo various treatments. For example, the insulation layer may be annealed, that is, treated with heat. Other treatments include nitridation which introduces nitrogen into the insulation layer. One such tool for nitridation is the decoupled plasma nitridation (DPN) chamber which utilizes a plasma for the nitridation process.

The gate 16 is typically formed of a conductive semiconductor material such as polysilicon. Alternatively, the gate 16 may be formed of a conductive metal including various metal alloys such as tantalum nitride and titanium nitride. A variety of tools may be used to deposit the gate 16. CVD and PVD chambers may be used to deposit a conductive film to form a gate. The gate stack 20 may have additional layers deposited on the gate 16 and may undergo various treatments including anneal treatments.

Figure 2:
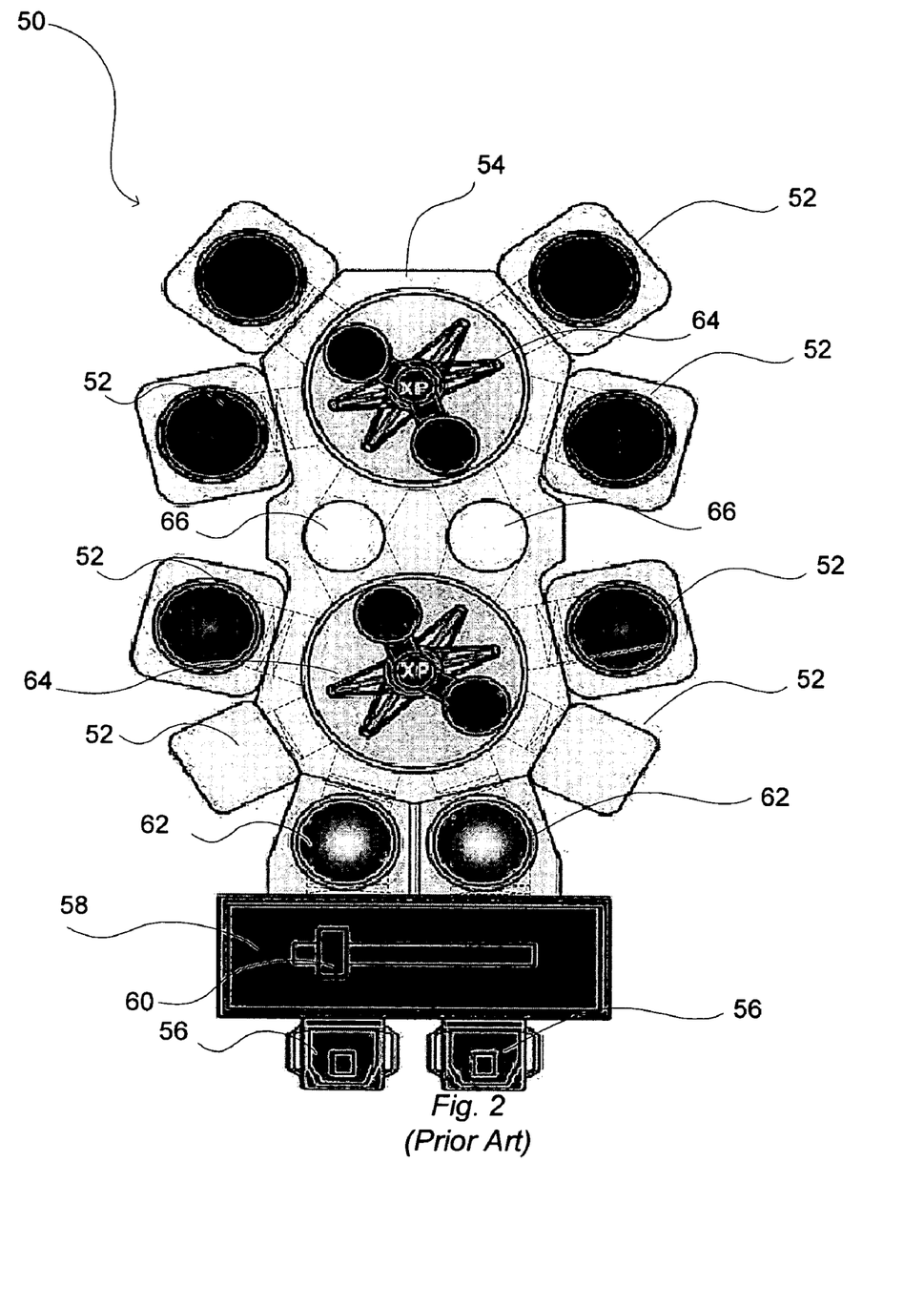
FIG. 2 is a schematic diagram of a multi-chamber plafform as practiced in the prior art.

FIG. 2 shows an example of a known platform 50 having a plurality of tools including processing chambers 52 coupled to ports of a mainframe 54. A front opening unified pod (FOUP) 56 carrying a stack of wafers may be coupled to a front end 58 which includes a robot 60 which transfers wafers, typically one at a time, from a FOUP 56 to a load lock chamber 62 of the mainframe 54. The interiors of the mainframe 54 and the processing chambers 52 are typically maintained at a very low pressure, often referred to as a vacuum pressure. After the load lock chamber 62 is pumped down to a low vacuum pressure, a mainframe robot 64 transfers the wafer to one or more of the processing chambers 52 to be processed. Processing may include deposition of a material. Other processing may include various treatments including orienting, cleaning, etching, annealing and chemical processing including nitridation, for example.

The mainframe 54 may have a plurality of mainframe robots 64 and a plurality of transfer chambers 66 through which wafers may be transferred from one mainframe robot 64 to another. Wafer processing may also occur in the transfer chambers 66. Such processing may include etching, cleaning, and wafer cooling, for example. Because the entire interior of the mainframe 54 may be maintained at a low vacuum pressure, a wafer may be transferred from chamber to chamber for processing without exposing the wafer to the pressure and contaminants of ambient air until processing is complete and the wafer is returned to a loadlock chamber 62.

Fabrication of a semiconductor device such as a gate stack may utilize a number of different processing chambers which may be coupled to a number of different platforms with robots to transfer the wafers being processed to the different chambers of each platform. Other processing chambers and processing devices such as anneal ovens may be stand alone devices. One known platform capable of fabricating an entire poly-silicon gate stack without exposing the wafer to the pressure and contaminants of ambient air until the gate stack is complete is the Applied Centura Ultima HDP-CVD platform by Applied Materials, Inc. The Applied Centura Ultima HDP-CVD combines base oxide growth in a CVD chamber, with decoupled plasma nitridation in an PNA chamber, both of which are secured to a single platform. A post nitridation anneal is performed in a PNA chamber also attached to the single platform. A CVD chamber which is also coupled to the single platform, deposits polysilicon on the stack to form the gate electrode of the stack.

DESCRIPTIONS OF ILLUSTRATIVE EMBODIMENTS

Figure 3:
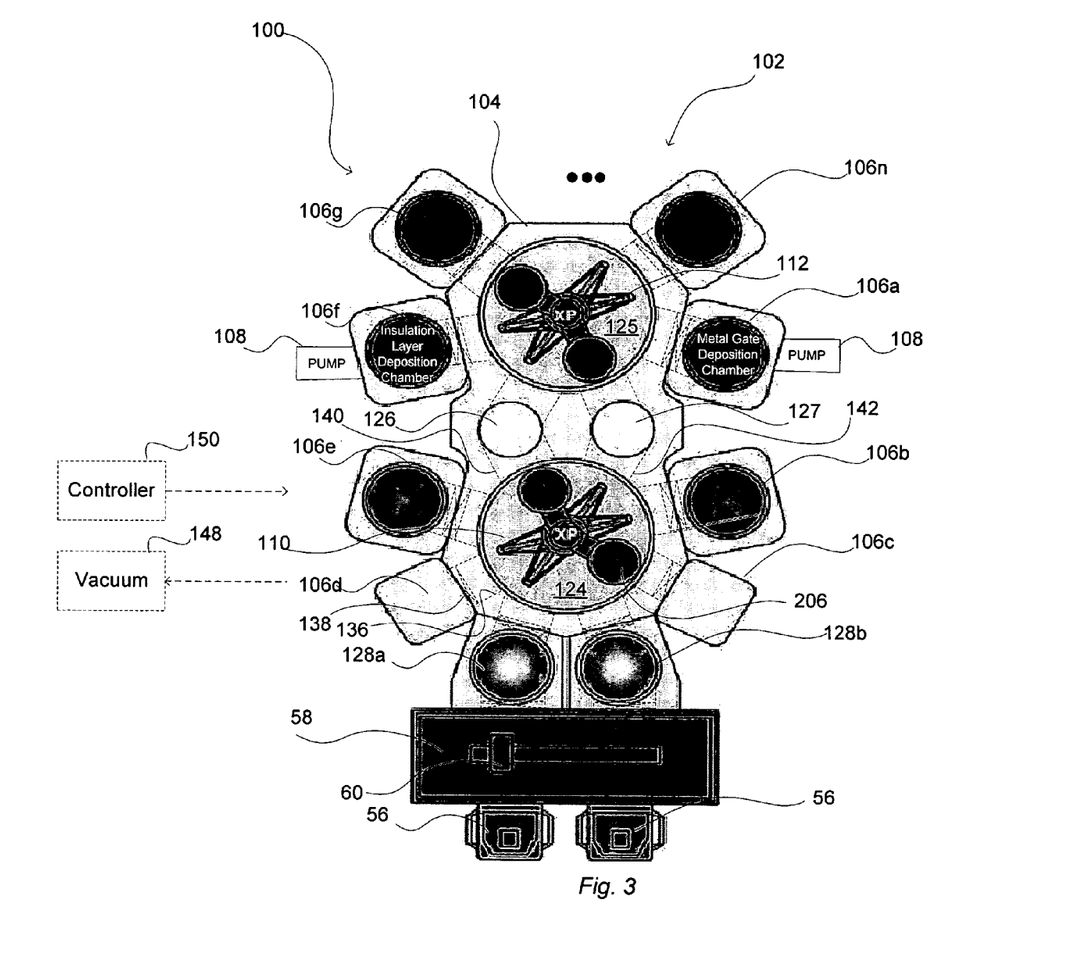
FIG. 3 is a schematic diagram of a multi-chamber platform in accordance with one aspect of the present description.

A system in accordance with one embodiment of the present invention is indicated generally at 100 in the schematic diagram of FIG. 3. The system 100 includes a platform 102 having a mainframe 104 and a plurality of processing chambers 106a, 106b . . . 106n coupled to the mainframe 104. It is appreciated that the number and types of processing chambers may vary, depending upon the particular application.

As described in greater detail below, the system 100 is capable of producing layers of various materials stacked on one another on a substrate without exposing the substrate to the pressure and contaminants of ambient air until the stack is complete. In one aspect, the stack of layers can include both insulative layers such as a layer of silicon dioxide or hafnium oxide, for example, and conductive metal layers such as a layer of tantalum nitride or ruthenium tantalum alloy, for example. Such stacks may have a variety of applications including use as a gate stack of a MOS transistor, for example. Thus, the processing chambers 106a, 106b . . . 106n may include at least one metal deposition chamber and at least one insulation layer deposition chamber for depositing layers in a stack.

In another aspect, one or more of the deposition chambers 106a, 106b . . . 106n may include a sputtering target for depositing material onto the stack. As described in greater detail below, a pulsed bias may be applied to the target to facilitate deposition of the target material in a suitable fashion.

In yet another aspect, one or more of the deposition chambers 106a, 106b . . . 106n may have associated therewith a pump which combines a turbomolecular pump and a cryogenic pump to generate an ultra high vacuum in that chamber. An example of such a pump is schematically represented as a pump 108 coupled to the processing chamber 106a which may be a PVD chamber for depositing a metal gate electrode layer in a stack. Another such pump 108 is shown coupled to the processing chamber 106f which may be, for example, a PVD chamber for depositing an insulative layer in a stack. As explained in greater detail below, the turbomolecular pump may be used to pump certain gasses including potentially hazardous gasses such as oxygen ($O_2$), methane ($CH_4$), hydrogen ($H_2$) etc. Conversely, the cryogenic pump may be used in a complementary fashion to trap other gasses such as water molecules, for example. Other features will be apparent from the following description.

In the illustrated embodiment, the mainframe 104 may be similar to the mainframe 54 of FIG. 2 and functions as a housing for a plurality of robots 110, 112. The mainframe 104 of this embodiment defines four chambers: a robot buffer chamber 124 at one end, a transfer robot chamber 125 at the opposite end, and a pair of intermediate processing or treatment chambers 126 and 127. Although one or more load lock chambers may be used, in the illustrated embodiment, two such chambers 128a, 128b are mounted to the buffer chamber 124 and in communication with the interior of the buffer robot chamber 124 via access ports 136 and associated slit valves 138. As described above, a plurality of vacuum processing chambers 106a, 106b . . . 106n are mounted about the peripheries of the robot buffer chamber 124 and the transfer robot chamber 125. (As used here, "plurality" means two or more.) The chambers 106a, 106b . . . 106n may be adapted for various types of processing including etching, annealing and/or deposition. Access is provided to and between each of the chambers by an associated port 136 and gate valve 138.

The robot chambers 124 and 125 communicate with one another via the intermediate processing or treatment chambers 126 and 127 (also called "treatment" chambers). Specifically, intermediate treatment chamber 126 is located along a corridor or pathway 140 which connects the transfer robot chamber 125 to the buffer 5 robot chamber 124. Similarly, the second intermediate treatment chamber 127 is located along a separate corridor or pathway 142 which connects the transfer robot chamber 125 to the buffer robot chamber 124. These separate paths between the two robot or transfer chambers permit one path to be used for loading or unloading while the system is being used for wafer processing treatment and, thus, provide increased throughput. Please note, the chambers 126 and 127 can be used for pre-treating (e.g., remote plasma etch cleaning and/or heating) of the wafers before processing in chambers 106a, 106b . . . 106n or post-treating (e.g., cool-down) of the wafers following treatment in chambers 106a, 106b . . . 106n; alternatively, one or both of the chambers 126 and 127 can be adapted for both pre-treatment and post-treatment.

In the illustrated embodiment, the platform mainframe 104 includes a monolith frame, that is, a frame machined or otherwise fabricated of one piece of material such as aluminum to form the four chamber cavities 124, 125, 126, and 127 and the interconnecting corridors or pathways 140 and 142. The use of the monolith construction facilitates alignment of the individual chambers for wafer transport and also facilitates sealing the individual chambers. It is appreciated that the frame of the mainframe may be assembled from multiple pieces, depending upon the particular application.

The platform 102 may be operated so that each chamber stage (main processing chambers 106a,106b, . . . 106n, transfer robot chamber 125, intermediate processing or transfer chambers 126, 127, buffer robot chamber 124, load lock chambers 128a, 128b) may be isolated from all the other chambers. In the illustrated embodiment, the operator has the option to vent none of the chambers or stages, with the exception of the cassette load lock(s) 128a, 128b, to atmosphere during processing. In addition, during wafer transfer, the operator can select as few as two adjacent chambers of the mainframe 104 to be in communication at any time, if appropriate. As a result, variations in vacuum level and, specifically, reductions in the vacuum level during wafer transfer can be minimized by using a vacuum pumping system 148, to provide a vacuum gradient across the system from the load locks 128a, 128b to the vacuum processing chambers 106a, 106f . . . 106n. The staged vacuum may be applied across the platform 102 with the degree of vacuum increasing in order from the load locks 128a, 128b to selected processing chambers 106a, 106f . . . 106n or 106b . . . 106e. Consequently, the time required to pump down a chamber 106a, 106b . . . 106n to its base vacuum level subsequent to the loading of a wafer therein may be minimized and very high degrees of vacuum can be used in the processing chambers without lengthy pump down times and, thus, without adversely affecting system throughput. Also, since the wafers can be pre-cleaned and/or pre-heated before entering high vacuum, there can be less system contamination and throughput can be increased. The particular pressures selected for each chamber may vary, depending upon the particular application.

In addition to the enhanced vacuum isolation, throughput and processing versatility provided by the intermediate stage chambers 26 and 27, the 25 abovementioned stations or chambers 106b . . . 106e can be mounted on the buffer robot chamber 124 to provide still additional processing isolation, flexibility and throughput enhancement. For example, the chambers 106b . . . 106e may be effectively isolated from the processing chambers 106a, 106f . . . 106n by the intervening individually isolated buffer chamber 124, intermediate transfer chambers 126 and 127 and robot transfer chamber 125. Thus, chambers 106b . . . 106e attached to the robot buffer chamber 124 may be conveniently used for processes which utilize a different (and/or incompatible) chemistry and/or different (typically lower) pressure relative to the group of processing chambers 106a, 106f . . . 106n attached to the robot transfer chamber 125. For example, the isolation facilitates the use of corrosive gas chemistry in the chambers 106a, 106f . . . 106n while reducing the impact on the atmosphere and processing/treatment in the chambers 106b . . . 106e, and vice versa.

Operation of the platform 102 may be controlled by one or more controllers, as schematically represented by the controller 150 of FIG. 3. Thus, the controller 150 can control, for example, the operations of the front end 58 including the operations of the FOUPs 56 and the front end robot 60, operations of the mainframe 104 including the mainframe robots 110,112, and the various pumps, gas supplies, valves and treatment equipment of the mainframe 104, and the operations of the processing chambers 106a, 106b . . . 106n. The controller 150 may be a programmed computer or other processor.

Processing of a wafer may be initiated by unloading the wafer from one of the FOUPs 56 via the front end 58 and placing the wafer in one of the load lock chambers 128a, 128b. Although the illustrated embodiment depicts FOUPs for housing wafers, it is appreciated that other devices including cassettes and racks may be used to support the wafers awaiting processing or following processing. It is further appreciated that other mechanisms may be used in place of the front end 58 to transfer a wafer to the mainframe 104. Following pumping the load lock chamber containing the wafer down to a suitable vacuum pressure, the wafer is ready for processing. At this point, the interior pressure of the load lock chamber 128a, 128b containing the wafer to be processed is at substantially the same vacuum pressure as the robot buffer chamber 124.

Figure 4:
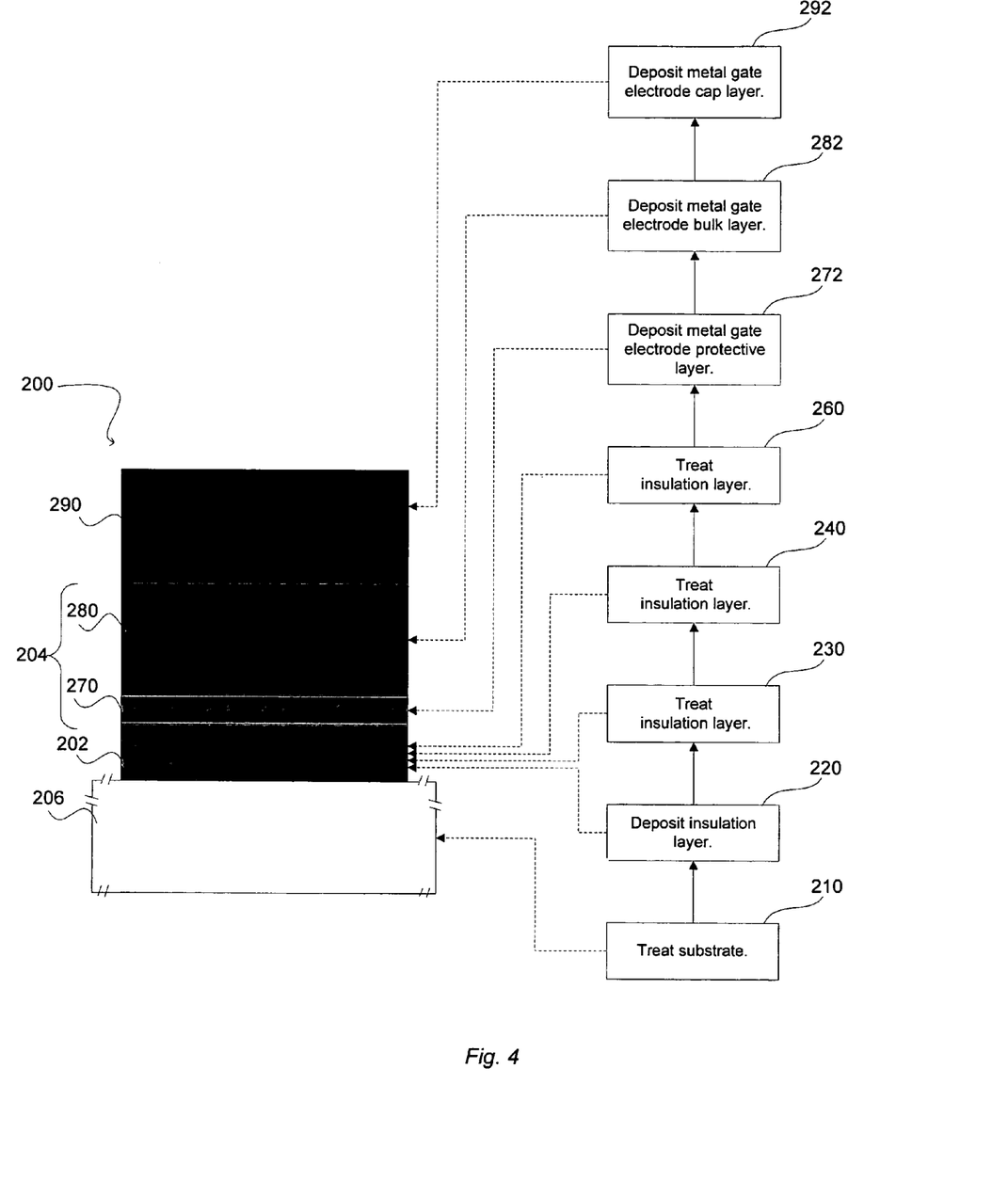
FIG. 4 illustrates an example of a gate stack and operations to fabricate the gate stack, in accordance with one aspect of the present description.

FIG. 4 illustrates one example of operations to fabricate a stack of layers on a substrate using the system 100 of FIG. 3. In this example, a gate stack 200 which includes both an insulation layer 202 and a metal gate electrode layer 204 is formed on a substrate 206. It is appreciated that other types of stacks of metal layers, insulative layers, and conductive layers, in various combinations may be fabricated as well, depending upon the particular application. For example, full silicidation of polysilicon gates, otherwise known as FUSI, may be combined with a deposited metal layer of nickel or cobalt, for example, to form a metal-silicide gate such as a nickel-silicide gate.

In a first operation, the substrate 206 is treated (block 210). In the illustrated embodiment, the substrate 206 is cleaned prior (that is, precleaned) to subsequent deposition operations. In this example, the wafer may be transferred by the robot 110 from a load lock chamber 128a, 128b to a suitable preclean chamber such as the chamber 106d, for example. As an example, the preclean can be processed in a Siconi chamber, where $NH_4F$ formed in a remote plasma is flown into the preclean chamber through showerheads and reaches the wafer surface, $NH_4F$ reacts with native oxide previously formed on the silicon substrate surface and forms $(NH_4)_2SiF_6$, which subsequently sublimates and leaves wafer surface during an annealing process carried out in the same chamber. It is appreciated that other treatments may be applied to the substrate, utilizing appropriate processing chambers 106a, 106b . . . 106n and treatment chambers 126, 127. During each transfer of the wafer within the mainframe 104, the vacuum pressure may be maintained such that the wafer is not exposed to ambient pressure or contaminants until the wafer is returned to a load lock chamber 128a, 128b following processing.

During precleaning the pressure of the preclean chamber 106d may be at a higher or lower pressure than that of the robot buffer chamber 124, depending upon the particular preclean process. Typically, the preclean process is performed at a vacuum pressure similar to that of the robot buffer chamber 124. However, prior to removing the cleaned wafer from the chamber 106d, gasses may be pumped from or into the chambers 106d, 124 as appropriate to equalize the pressure of the chamber 106d to that of the vacuum pressure of the robot buffer chamber 124.

As mentioned above, additional treatments may be applied to the substrate prior to deposition. Thus, for example, the wafer may be transferred by the robot 110 from the preclean chamber 106d to a suitable degas chamber such as the chamber 106c, for example. Here too, the pressure of the degas chamber 106c may be at a higher or lower pressure than that of the robot buffer chamber 124, depending upon the particular degas process. However, prior to removing the cleaned wafer from the chamber 106c, gasses may be pumped from or into the chambers 106c, 124 as appropriate to equalize the pressure of the chamber 106c to that of the vacuum pressure of the robot buffer chamber 124.

In another operation, an insulation layer may be deposited (block 220) on the substrate 206. In this example, the wafer may be transferred by the robot 110 from the degas chamber 106c via a transfer chamber 126, 127 to the second robot 112 of the robot transfer chamber 125. The substrate 206 may receive further treatments such as preheat treatment in the transfer or treatment chamber 126, 127. The robot 112 may transfer the substrate 206 to a suitable deposition chamber such as the chamber 106f, for example. In the illustrated embodiment, the deposition chamber is a PVD chamber having a target of suitable material such as silicon or hafnium silicide (HfSi), for example. It is appreciated that other dielectric or insulation layer deposition 10 chambers may be used including CVD and atomic layer deposition (ALD) chambers.

During the insulation layer deposition, the pressure of the insulation layer deposition chamber 106f may be at a higher or lower pressure than that of the robot buffer chamber 124, depending upon the particular deposition process. Various working and deposition gasses may be admitted into the chamber during the deposition process. For example, oxygen may be admitted during the sputtering of a HfSi target to produce a suitable dielectric film or layer 202 of $HfSiO_x$ on the substrate 206. For some applications an insulation layer having a high K property is appropriate. It is appreciated that other types of insulation films may be deposited, depending upon the particular application. Additional examples of suitable metal gate dielectrics include tantalum oxide ($TaO_x$), hafnium oxide ($HfO_x$), etc.

The insulation layer 202 may be deposited to a thickness below 10 nanometers (100 angstroms), for example. The insulation layer 202 may in some applications be even thinner including thicknesses of 50, 30, 25 or 20 angstroms. The deposition layer 202 may be deposited in a single film or in a plurality of insulative films built-up, one upon another. Other thicknesses may be used, depending upon the particular application.

In the illustrated embodiment, various gasses may be removed from the insulation layer deposition chamber 106f prior to removing the wafer from the chamber 106. As explained in greater detail below, a combination turbomolecular and cryogenic pump such as the pump 108 may be utilized to remove any hazardous or otherwise deleterious gasses prior to opening the slit valve 138.

In another operation, the insulation layer 202 may be treated (block 230). In this example, the insulation layer 202 may be treated with an anneal treatment in situ, that is, in place inside the insulation deposition chamber 106f prior to removing the wafer from the chamber 106f. The anneal treatment may be applied by a chuck such as an electrostatic chuck having a suitable heating element such as a resistive heating element. It is appreciated that an anneal treatment may be applied by other types of heaters, depending upon the particular application. In the illustrated embodiment, the anneal treatment may be applied at a suitable temperature such as 450 degrees C., for example, for a suitable period of time such as 1-3 minutes, for example. The in situ anneal may be applied under vacuum without additional treatment gasses. Alternatively, various treatment gasses may be supplied into the chamber during the anneal treatment including nitrogen, argon, $NH_3$, $CH_4$. Such an anneal treatment can improve film properties, such as reducing leakage current, in some applications. It is appreciated that the anneal treatment parameters may vary, depending upon the particular application.

Other treatments may be applied to the insulation layer 202 without exposing the wafer to the ambient conditions outside the mainframe 104. In the illustrated embodiment, the wafer 202 is removed from the insulation layer deposition chamber 106f by the robot 112 and transferred to another treatment chamber for treatment (block 240). Prior to removing the wafer from the insulation deposition chamber 106f, selected gasses may be removed form the chamber 106f and the interior pressure of the deposition chamber 106f may be equalized to that of the robot transfer chamber 125. In this example, the deposited insulation layer 202 is treated with a nitridation treatment by a decoupled plasma nitridation chamber 106e. The robot 112 passes the wafer with the deposited insulation layer to the robot 110 via the transfer chamber 126 or 127. The wafer may be treated in the transfer chamber 126, 127 with various treatments such as cool down, for example, prior to being picked up by the robot 110.

Nitridation is a process which infuses nitrogen into a layer to provide various properties to the deposited film. It is appreciated that a variety of chambers and techniques may be used for nitridation.

Still other treatments (block 260) may be applied to the deposited insulation layer 202 within the mainframe 104 without exposing the wafer to ambient pressure. For example, a post nitridation anneal may be applied either in situ in the DPN chamber 106e or in another chamber as the deposition chamber 106f or a (rapid thermal processing) RTP chamber in the system. In the illustrated embodiment, the in situ anneal treatment is applied by an electrostatic chuck with a suitable heating element. Again, in the illustrated embodiment, the anneal treatment may be applied at a suitable temperature such as 450 degrees C., for example, for a suitable period of time such as 1-3 minutes, for example. Various treatment gasses may be supplied into the chamber during the anneal treatment including nitrogen and argon. It is appreciated that the anneal treatment parameters may vary, depending upon the particular application. Prior to removing the wafer from the in situ anneal chamber, selected gasses may be removed from the chamber and the interior pressure equalized to the robot buffer or transfer chamber 126, 127 as appropriate.

In another operation, a thin protective metal gate electrode layer 270 may be deposited (block 272) on the treated insulation layer 202. In this example, the wafer may be transferred by the robot 110 from the DPN chamber 106e via a transfer chamber 126,127 to the second robot 112 of the robot transfer chamber 125. The substrate 206 may receive further treatments such as preheat or cool down treatment in the transfer or treatment chamber 126,127. The robot 112 may transfer the substrate 206 to a suitable deposition chamber such as the chamber 106g, for example. In the illustrated embodiment, the deposition chamber is an atomic layer deposition chamber. An atomic layer deposition chamber can deposit a film as thin as one atom or one molecule in thickness at a time. Thus, the layer 270 can be built up in multiple depositions of thin films in the ALD chamber 106g, one thin film at a time, each film being as thin as an atom or molecule. Such a deposition process can reduce or eliminate damage to the underlying insulative layer 202 on which the thin films are being deposited. A thin layer of film deposited by ALD may also be used to modulate the effective work function of the metal gate stack, and/or may be used as a glue layer to enhance the adhesion between certain insulative films and metal films. It is appreciated that other conductive metal deposition chambers may be used including PVD and CVD chambers.

U.S. Pat. No. 6,833,161, incorporated herein by reference in its entirety, describes a suitable atomic layer deposition (ALD) chamber and suitable processes for depositing films using the ALD chamber. As described therein, a tungsten nitride layer, for example, may be deposited in an ALD chamber by alternately "pulsing" a tungsten containing compound and pulsing a nitrogen containing compound. A pulse refers to a quantity of a particular compound that is intermittently or non-continuously introduced into a reaction zone of an ALD chamber. The quantity of a particular compound within each pulse may vary over time, depending upon the duration of the pulse.

In the illustrated embodiment, the deposited insulation layer 202 is not exposed to ambient atmosphere prior to deposition of the metal gate electrode layer. Instead, the wafer with the deposited insulation layer 202 is passed through one or more of the mainframe chambers 124, 125, 126, 127 which may be maintained at a suitable vacuum level pressure. In addition, in one embodiment, the insulation layer is 15 not cleaned prior to deposition of the metal gate layer. Thus, a cleaning treatment which might damage the deposited insulation layer 202 may be avoided, depending upon the particular application.

By depositing an initial relatively thin metal gate electrode layer 270 by a chamber such as an atomic layer deposition chamber 106g, damage to the insulation layer 202 may be reduced. A subsequent bulk metal gate electrode layer 280 may then be deposited (block 282) by another chamber such as a PVD chamber 106a, for example. Thus, a PVD film may be deposited right after an ALD film is deposited without exposing the ALD film to ambient air, to make a sandwiched structure. Such a sandwiched structure may have a variety of beneficial properties including a work function which is modulated by the sandwiched structure. It is believed that work function of the metal gate stack may be a function of both the work function of the layer 270 and the overlying bulk layer 280 if the layer 270 is sufficiently thin, such as 30 angstroms or less, for example. In addition, the layer 270 may protect the insulation layer 202 from some damage which may be caused by the deposition of the bulk layer 280. Still further, the layer 270 may act as an effective diffusion barrier to retard the diffusion of gate electrode materials from diffusing into dielectrics and silicon. Yet another example is to use layer 270 to enhance adhesion between layer 280 and layer 202. It is appreciated that other features of the protective layer 270 may be utilized either in addition to or instead of those described herein, depending upon the particular application.

It is appreciated that the metal gate electrode layers 270, 280 may be deposited using a variety of different deposition chambers attached to the mainframe 104. For example, a thin metal gate electrode layer 270 may be deposited by the PVD chamber 106a in a first low deposition rate to reduce damage to the underlying insulation layer 202. During deposition of the thin metal gate electrode layer 270, power to the target 303 may be relatively low, such as 100-2000 watts, for example. In addition, the chamber interior pressure may be relatively high, such as 3-10 milliTorr, for example. Still further, a relatively balanced magnetron may be used to reduce ionization of the deposition material. A low power, low ionization, high pressure deposition may reduce damage to the underlying insulative layer. Following deposition of the thin protective layer 270, a bulk gate electrode layer 280 may be deposited in the same PVD chamber 106a at a substantially higher deposition rate. During deposition of the bulk metal gate electrode layer 280, power to the target 303 may be relatively high, such as 500-5000 watts, for example. In addition, the pressure may be relatively low, such as 1-5 milliTorr, for example, to reduce scattering. It is appreciated that in other applications, a metal gate electrode may be deposited in a single layer or in more than two layers, depending upon the particular application. The PVD chamber may also have a target laterally offset with respect to the substrate as described in copending application entitled "Protective Offset Sputtering" filed concurrently herewith, assigned to the assignee of the present application and incorporated by reference in its entirety.

The material or materials of the metal gate electrode layers may be selected from a variety of conductive metals including tantalum, tantalum nitride, $Ta_xRu_y$, $TaSi_xN_y$, hafnium, hafnium nitride, tungsten, tungsten nitride, ruthenium, ruthenium oxide, platinum, titanium, titanium nitride, etc. The thicknesses of the films or layers 270, 280 may also vary, depending upon the particular application. In the illustrated embodiment the thin protective metal gate electrode layer 270 has a thickness in a range of 5-30 angstroms, for example, and the bulk metal gate electrode layer 280 has a thickness in a range of 30-600 angstroms, for example. It is appreciated that the thicknesses may vary, depending upon the particular application.

During the metal gate electrode layer deposition, the pressure of the deposition chamber 106g or 106a may be at a higher or lower pressure than that of the robot transfer chamber 125, depending upon the particular deposition process. Various working and deposition gasses may be admitted into the chamber during the deposition process. For example, argon and nitrogen may be admitted during the sputtering of a metal target to produce a suitable conductive metal film or layer 270, 280 on the insulation layer 202. Such conductive metal materials may include tantalum, tantalum nitride, titanium, and titanium nitride, for example. It is appreciated that other types of conductive metal films may be deposited, depending upon the particular application.

In the illustrated embodiment, various gasses may be removed from the PVD deposition chamber 106a prior to removing the wafer from the chamber 106a. As explained in greater detail below, a combination turbomolecular and cryogenic pump such as the pump 108 may be utilized to remove any hazardous or otherwise deleterious gasses prior to opening the slit valve 138. In addition, prior to removing the wafer from the chamber 106a, gasses may be pumped from or into the chamber 106a as appropriate to equalize the pressure of the chamber 106a to that of the vacuum pressure of the robot transfer chamber 125.

In another operation, a protective cap layer 290 may be deposited (block 292) on the metal gate electrode layer 280. In this example, the wafer may be transferred by the robot 112 from the PVD chamber 106a via a transfer chamber 126, 127 to the other robot 110 of the robot buffer chamber 124. The substrate 206 may receive further treatments such as preheat or cool down treatment in the transfer or treatment chamber 126, 127. The robot 110 may transfer the substrate 206 to a suitable deposition chamber such as the chamber 106b, for example. In the illustrated embodiment, the deposition chamber 106b is a chemical vapor deposition chamber and is used to deposit a layer 290 of polysilicon on the metal gate electrode layer 280.

It is appreciated that other deposition chambers may be used including ALD and PVD chambers. It is further appreciated that the cap layer 292 may be formed of other materials and may be omitted, depending upon the particular application. The cap layer 290 may be used to further confine the gate electrode materials. It is appreciated that the cap layer 290 may provide other features in addition to or instead of those described herein. The cap layer 290 may have a thickness in the range of 100-500 angstroms, for example. It is appreciated that other thicknesses may be used, depending upon the particular application.

Figure 5:
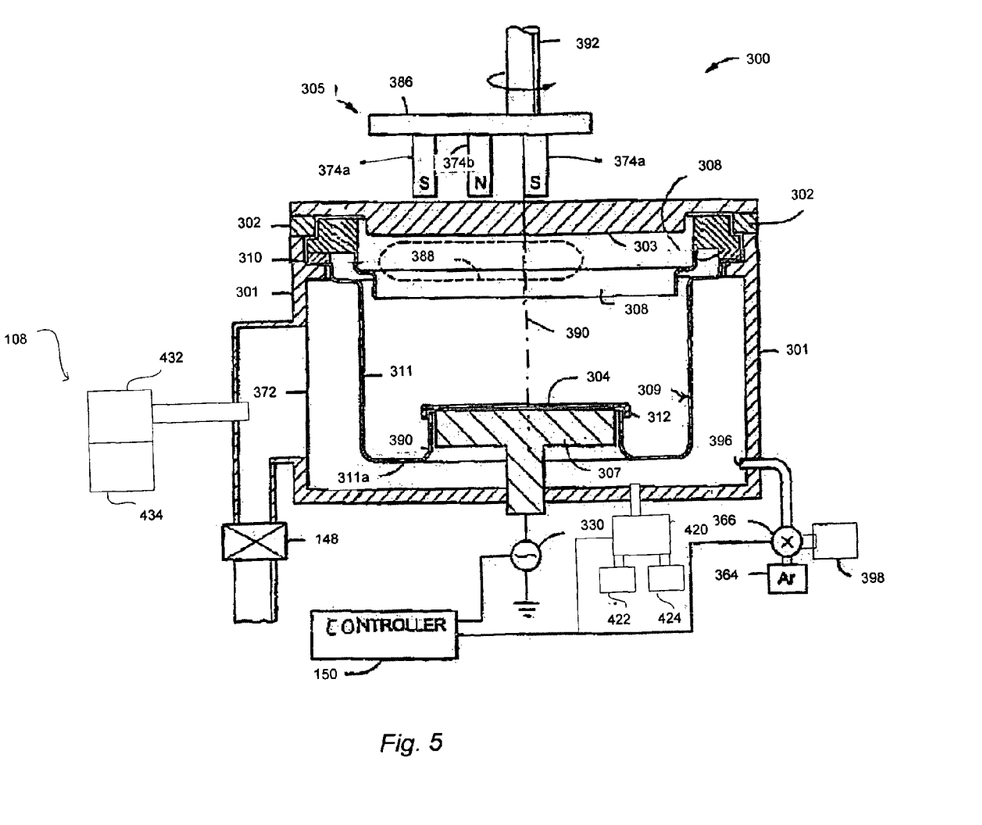
FIG. 5 is a schematic representation of a sputtering chamber usable with an embodiment of the present description.

A chamber or reactor which is believed capable of depositing a suitable sputtered film, is indicated generally at 300 in FIG. 5. A PVD chamber 106f or a PVD chamber 106a may be similar to the reactor 300, which, in the illustrated embodiment, is a magnetron type reactor based on a modification of the Endura PVD Reactor available from Applied Materials, Inc. of Santa Clara, Calif.

The reactor 300 includes a vacuum chamber 301, usually of metal and electrically grounded, sealed through a target isolator 302 to a PVD target 303 having at least a surface portion composed of material to be sputter deposited on a wafer 304. A magnetron 305 coupled to the target 303 generates a plasma adjacent to the target for sputtering the target. As previously mentioned, the magnetron 305 may be a relatively balanced magnetron to reduce ionization of the sputtered deposition material. It is appreciated that the type of magnetron may vary, depending upon the particular application.

The wafer also referred to as a substrate or workpiece, may be different sizes including 150, 200, 300 and 450 mm. In addition to silicon, the wafer may be composed of glass or other materials. A pedestal electrode 307 has a support surface which supports the wafer. In some applications, the pedestal electrode 307 may bias the wafer 304 to attract ionized deposition material. In other applications, biasing of the wafer may be reduced or eliminated to further reduce the potential for damage to the deposited insulative layer. An electrostatic chuck 312 holds the wafer 304 on the pedestal electrode 307. It is appreciated that other devices may be used to hold the wafer 304 in place during processing. Resistive heaters, refrigerant channels, and a thermal transfer gas cavity in the pedestal 307 can be provided to allow the temperature of the pedestal to be controlled to temperatures of less than −40° C., thereby allowing the wafer temperature to be similarly controlled.

The electrostatic chuck 312 also has resistive heating elements to permit in situ annealing of the wafer 304. It is appreciated that other types of heating elements may be utilized as well.

The reactor 300 also biases the target 303. In one aspect of the illustrated embodiments, the bias signal applied to the target 303 may be pulsed in a manner which can reduce arcing, particularly when sputtering an insulative film. In the illustrated embodiment, the bias signal applied to the target 303 includes a plurality of alternating first and second intervals wherein in each of the first intervals, the voltage of the applied bias signal is negative to attract ions to sputter the target. In the alternating second intervals, the applied bias signal has a positive voltage to repel positively charged ions from the target 303 to reduce arcing.

It is appreciated that a pulsed bias signal applied to a target may provide other features, depending upon the particular application. For example, it is believed that other potential features, depending upon the particular application, include a reduction in deposition rate, a more stable plasma, and increased peak energy in the plasma for effective chemistry in multi-component films. For example, films which are closer to true stoichiometric proportions might be obtained when a pulsed biasing signal is applied to a target 303 having stoichiometric sputtering materials. Sill other possible features include an increase in film quality, particularly for multi-component films which include materials such as titanium nitride, tantalum nitride, etc. It is also believed that film sheet resistance may be reduced, due to possible elimination of micro voids and columnar structures, when a pulsed bias is applied. It is appreciated, however, in some applications, a nonpulsed biasing signal, that is, a DC bias signal, may be applied to bias the target 303, depending upon the particular application.

In addition to alternating the voltage of the bias signal applied to the target 303, the power applied to bias the target may be modulated in a plurality of alternating first and second intervals wherein in each of the first intervals, the power level is at a first level sufficiently high to sputter the target 303. In some applications, the power may also be high enough to maintain a plasma adjacent to the target capable of ionizing target material sputtered from the target. However, in many applications the power may be limited to reduce or eliminate ionization of the deposition material. In each of the second intervals, the power may be low as a positive bias voltage is applied to the target. As a consequence, of the low power and positive voltage, little or no sputtering of the target may occur in this interval. The overall sputtering rate will be an average of the sputtering rates in the alternating intervals. As a consequence, the average sputtering rate can be sufficiently low to facilitate thin film deposition. In the illustrated embodiment, the durations of the first intervals of higher power, negative voltage application can be selected to be longer than the durations of the second intervals of lower power, positive voltage application to provide a suitable deposition rate. Alternatively, the durations of the first intervals of higher power, negative voltage application can be selected to be shorter than the durations of the second intervals of lower power, positive voltage application to reduce further the average of the power applied to the target and thus to reduce the deposition rate further.

Pulsed biasing of the target 303 may be beneficial for depositing a variety of films including thin films. Additional examples of thin films which may be deposited in accordance with the descriptions provided herein may include sputtering processes which sputter W, Ni, Co. RuTa, NiFe, Ta, etc., or reactive sputtering processes which form $W_xN_y$, $Hf_xN_y$, $TaSi_xN_y$, $Ru_xO_y$, $Ta_xO_y$, etc. It is appreciated that other materials may be sputtered, either in a direct deposition, or in a reactive deposition, depending upon the particular application.

A darkspace shield 308 and a chamber shield 309 separated by a second dielectric shield isolator 310 are held within the chamber 301 to protect the chamber wall 301 from the sputtered material. In one embodiment, the darkspace shield 308 is permitted to float electrically and the chamber shield 309 is electrically grounded. However, in some embodiments, either or both shields may be grounded, floating or biased to the same or different nonground levels. The chamber shield 309 can also act as an anode grounding plane in opposition to the cathode target 303 and the RF pedestal electrode 307, thereby capacitively supporting a plasma. If the darkspace shield is permitted to float electrically, some electrons can deposit on the darkspace shield 308 such that a negative charge builds up there. It is believed that the negative potential could not only repel further electrons from being deposited, but also confine the electrons in the main plasma area, thus reducing the electron loss, sustaining low-pressure sputtering, and increasing the plasma density, if desired. The plasma darkspace shield 308 is generally cylindrically-shaped. The plasma chamber shield 309 is generally bowl-shaped and includes a generally cylindrically shaped, vertically oriented wall 311. It is appreciated that the shields may have other shapes as well.

Figure 6:
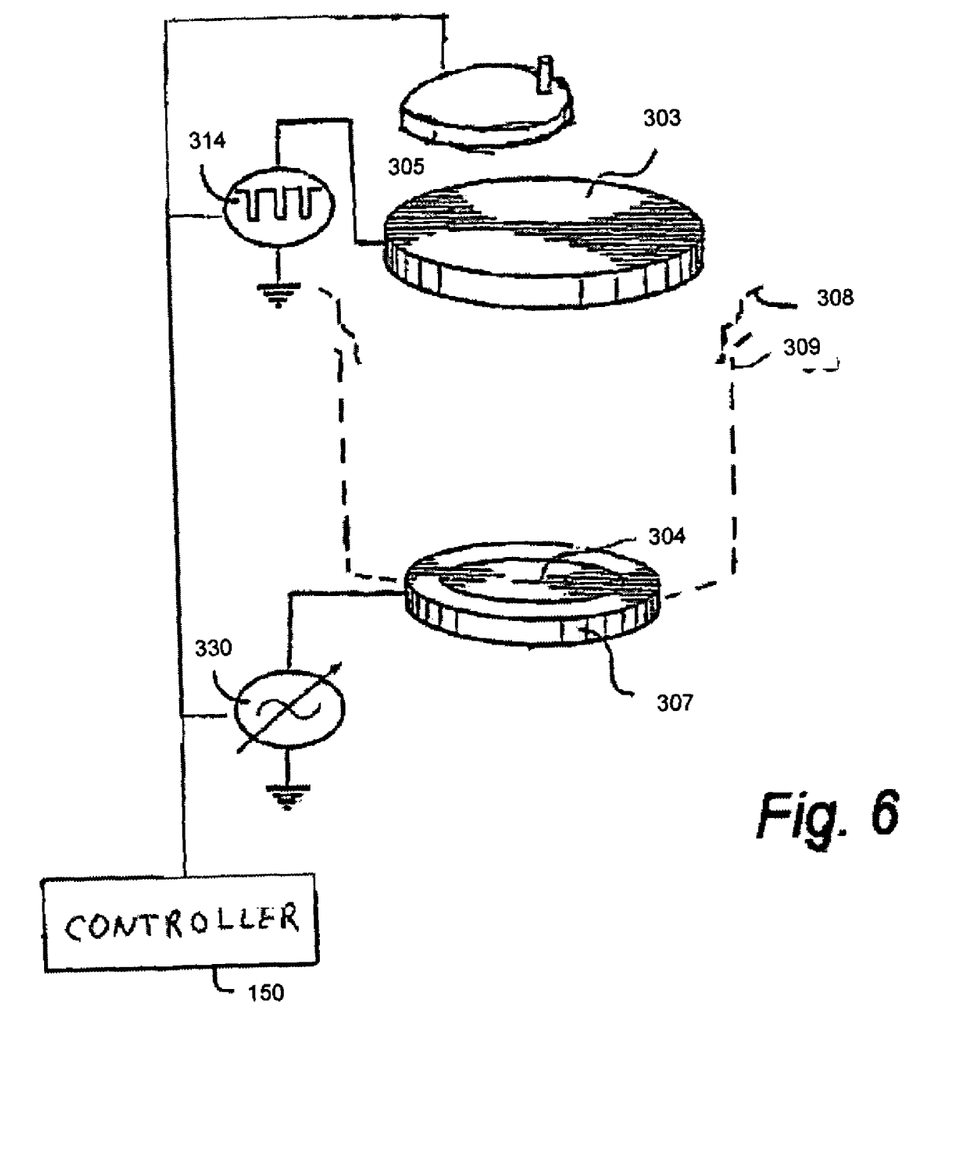
FIG. 6 is a schematic representation of electrical interconnections of various components of the sputtering chamber of FIG. 5.
Figure 7:
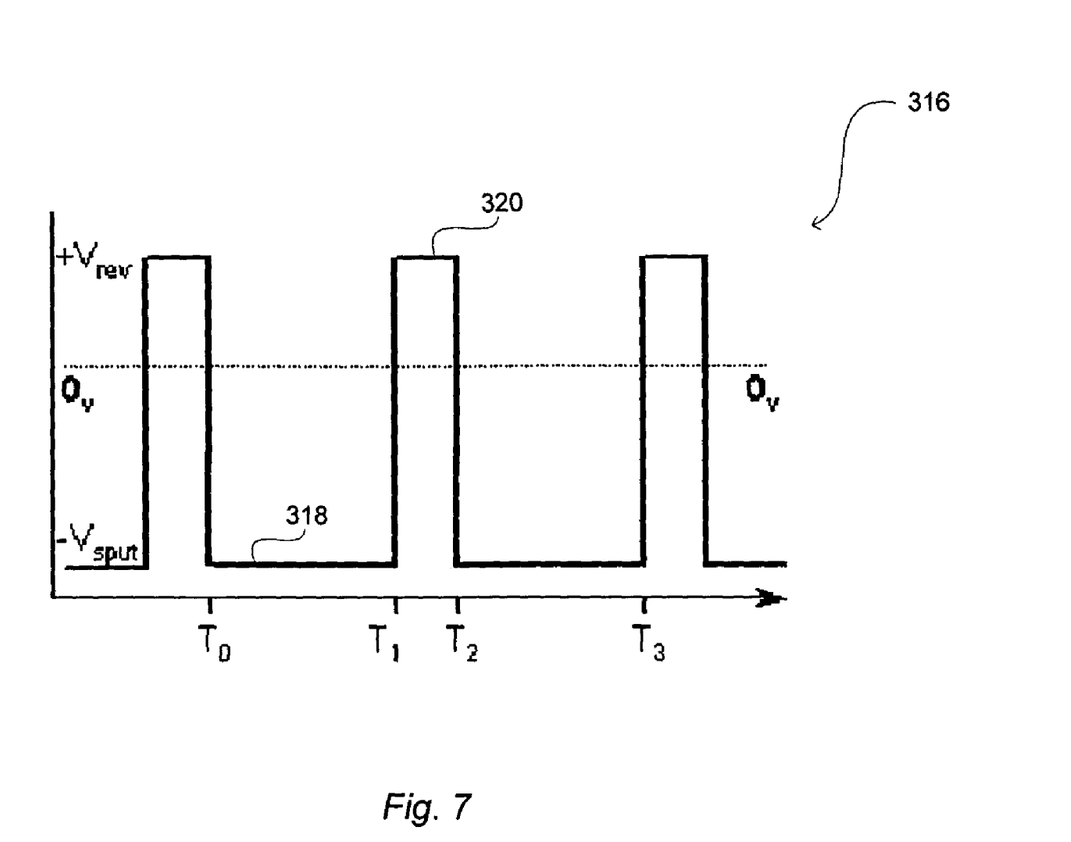
FIG. 7 is a graph depicting a voltage pulsetrain for biasing the target of FIG. 5 in accordance with one embodiment of the present description.

FIG. 6 is a schematic representation of the electrical connections of the plasma generating apparatus of the illustrated embodiment. To attract the ions generated by the plasma to sputter the target 303 the target 303 is in one embodiment alternately negatively and positively biased by a pulse type power source 314 to provide an average power of 1-4 kW, for example. A schematic diagram of one example of a suitable voltage pulse train 316 for biasing the target, is depicted in FIG. 7. The voltage pulse train 316 includes a plurality of negative voltage pulses 318 alternating with positive voltage pulses 320. Application of the voltage pulse train 316 results in a power pulse train, a schematic representation of which is indicated at 322 in FIG. 8.

Figure 8:
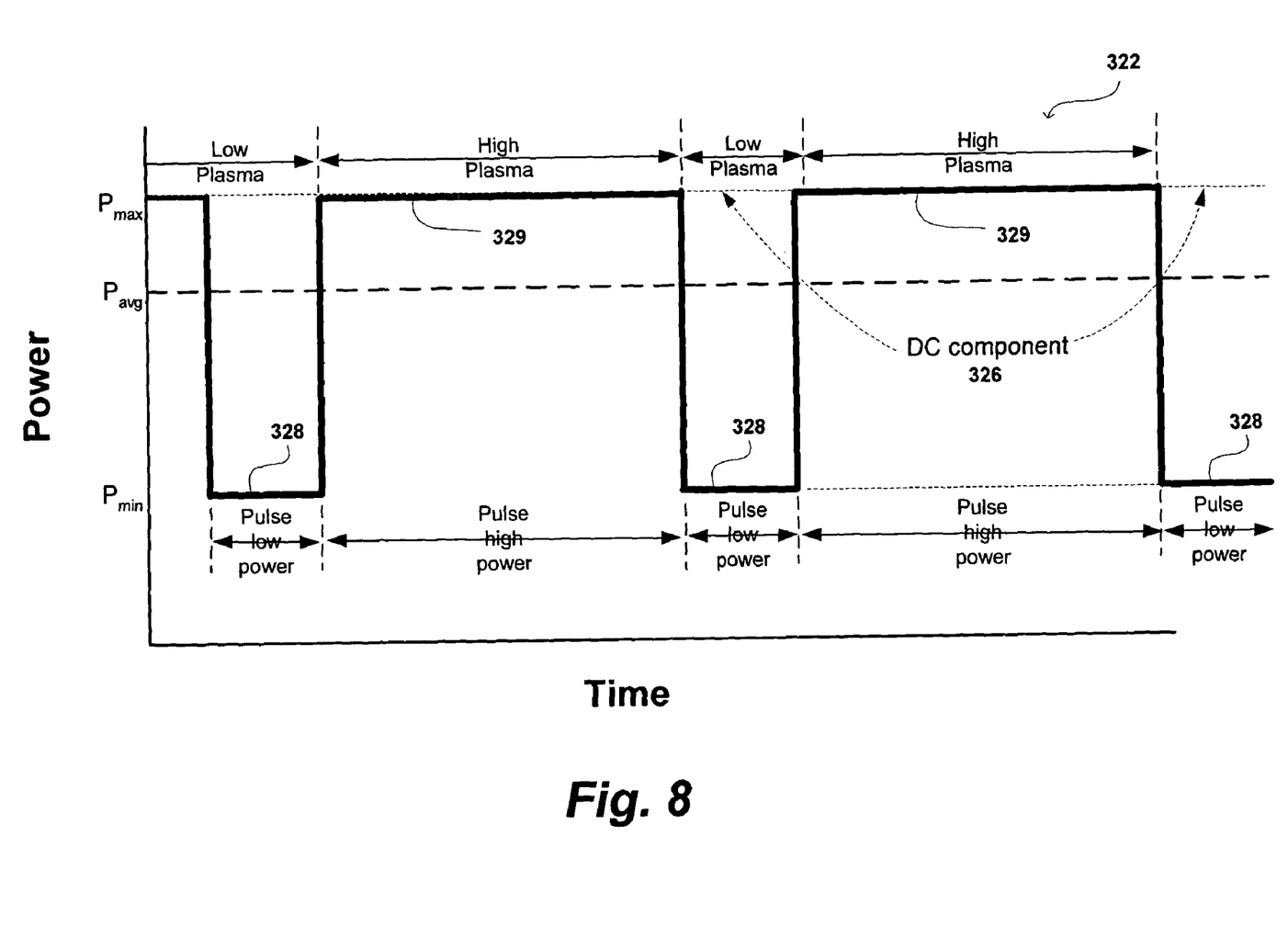
FIG. 8 is a graph depicting a power pulsetrain for biasing the target of FIG. 5 in accordance with one embodiment of the present description.

The power pulse train 322 includes a plurality of pulses superimposed on a DC component 326. The DC component of the source 314 results from the negative voltage pulses 318 which negatively bias the target 303 to about −200 to −600 VDC with respect to the chamber shield 309 to ignite and maintain the plasma, at least during the duration of each negative voltage pulse 318. A voltage less than −1000 VDC is generally suitable for many applications. In the illustrated embodiment, the DC component 326 of the pulse train 202 represents the maximum power $P_{max}$ of the pulse train. A target power of between 0.1 and 5 kW is typically used to ignite a plasma while a greater power of greater than 10 kW is often preferred for self ionizing plasma (SIP) sputtering. In this embodiment, a suitable power range for the maximum power $P_{max}$ of the power pulse train 322 is believed to be 0.1 to 10 kW with a range of 500 watts to 4 K watt preferred. This maximum power is applied to negatively bias the target to maintain a plasma and to sputter the target to deposit a film on the wafer.

Superimposed on the DC component is the plurality of pulses of the pulse trains 322, each of which alternates between a "pulse low power" interval 328 in which the power minimum $P_{min}$ is applied to the target as a positive voltage pulse 320 is applied to the target, and a "pulse high power" interval 329 in which a power maximum as represented by $P_{max}$ is applied to the target as the negative voltage pulse 318 is applied to the target. During each "pulse low power" interval, the power applied to the target is relatively low. As a consequence, the plasma density adjacent the target, the target sputtering rate and the deposition material ionization rate are all relatively low or extinguished during each pulse low power interval.

During each "pulse high power" interval, power $P_{max}$ applied to the target is higher. As a consequence, the plasma density adjacent the target and the target sputtering rate are higher during each pulse high interval. In the one embodiment, the power level $P_{max}$ of each pulse high interval may be sufficiently limited to avoid or reduce a self ionizing plasma (SIP) to reduce or avoid the ionization of a significant portion of the material being sputtered from the target during each pulse high period, if appropriate, depending upon the application. For example, ionization of the deposition material may be reduced or avoided to reduce or eliminate damage to the insulative layer. However, in some applications, ionization of deposition material may be appropriate to facilitate bottom coverage of deep aspect ratio holes yet maintaining a sufficiently low average sputtering rate to facilitate thin film depositions.

Although the sputtering rate of the target may rise substantially during each pulse high interval, it is appreciated that the average power $P_{avg}$ applied to the target is lower than the maximum power $P_{max}$. Consequently, the average sputtering rate will similarly be lower than the sputtering rate during the pulse high intervals alone. For thin film applications, it is believed that a suitably low average sputtering rate may be achieved by appropriate selections of the high and low power levels, $P_{max}$ and $P_{min}$, and the durations of the respective pulse low and pulse high intervals. For many such applications, it is believed that providing pulse high power intervals longer in duration than pulse low power intervals may provide suitable results.

In the illustrated embodiment, deposition of a thin layer may be accomplished in 30 seconds for example. During this 30 second deposition period, the power supply to the target may be pulsed at a frequency of 25 Khz, for example, Thus, the period T0 to T2 of FIG. 7 would be 40 micro seconds. A frequency in the range of 0-200 KHz is believed suitable for a number of applications. The duty cycle of the voltage pulse train 316 may be 0-40%, for example. Thus, at 25 KHz, the interval T1 to T2 may be 0-16 microseconds, for example. The pulse frequency may vary, depending upon the application. Also, the duration of the positive pulse may vary as well. Values for the parameters including $P_{max}$, $P_{min}$, and the interval durations may be determined empirically. These parameters may be affected by the particular design goals of the application including repeatability of results, the thickness of the deposited layer and the uniformity of the deposited layer. In the illustrated embodiment, an average power $P_{avg}$ in the range of 500 W-5000 W for material such as Ti and Ru is believed to be suitable.

In the illustrated embodiment, the values $P_{max}$, $P_{min}$, and the pulse high and pulse low interval durations are depicted as being relatively constant from interval to interval. It is appreciated that these values may vary from interval to interval, and within each interval, depending upon the particular application. Moreover, the voltage or current output of the source 314 may be modulated as appropriate.

In those applications in which the ionization of deposition material is to be reduced or avoided, the wafer 304 may be left floating electrically. In another applications, the wafer may be biased to attract or repel ions as appropriate for that application.

For example, a source 330 may be provided to apply RF power to the pedestal electrode 307 to bias the wafer 304 to attract deposition material ions during SIP sputter deposition. In addition, the source 330 may be configured to apply RF power to the pedestal electrode 307 to couple supplemental energy to the plasma. During SIP deposition, the pedestal 307 and hence the wafer 304 may be left electrically floating, but a negative DC self-bias may nonetheless develop on it.

Alternatively, the pedestal 307 may be negatively biased by a source at a negative voltage of −30 VDC, for example, to negatively bias the wafer 304 to attract the ionized deposition material to the substrate. In yet another alternative, the wafer 304 may be left floating electrically.

If the source 330 biasing the wafer through the pedestal is an RF power supply, the supply may operate at a frequency of 13.56 MHz, for example. Other frequencies are suitable such as 60 MHz, depending upon the particular application. The pedestal 307 may be supplied with RF power in a range of 10 watts to 5 kW, for example, a more preferred range being 150 to 300 W for a 200 mm wafer in SIP deposition.

The above-mentioned power and voltage levels and frequencies may vary of course, depending upon the particular application. A computer-based controller 150 may be programmed to control the power levels, voltages, currents and frequencies of the various sources in accordance with the particular application.

Returning to the large view of FIG. 5, the lower cylindrical portion 311 of the chamber shield 309 continues downwardly to well below the top of the pedestal 307. The chamber shield 309 then continues radially inward in a bowl portion 311a and vertically upward in an innermost cylindrical portion 306 to approximately the elevation of the wafer 304 but spaced radially outside of the pedestal 307.

The shields 308, 309 are typically composed of stainless steel, and their inner sides may be bead-blasted or otherwise roughened to promote adhesion of the material sputter deposited on them. At some point during prolonged sputtering, however, the deposited material builds up to a thickness that is likely to flake off, producing deleterious particles. Before this point is reached, the shields 308, 309 should be cleaned or replaced. However, the more expensive isolators 302, 310 do not need to be replaced in most maintenance cycles. Thus, the maintenance cycle is determined by flaking of the shields.

As mentioned, the darkspace shield 308, if floating can accumulate some electron charge and build up a negative potential. Thus biased, it repels further electron loss to the darkspace shield 308 and confines the plasma nearer the target 303. Ding et al. have disclosed a similar effect with a somewhat similar structure in U.S. Pat. No. 5,736,021. In selecting an appropriate darkspace shield, it is noted that the darkspace shield 308 electrically shields the chamber shield 309 from the target 303 so that it should not extend too far away from the target 303. If it is too long, it is believed it can become more difficult to strike the plasma; but, if it is too short, it is believed that electron loss can increase such that sustaining the plasma at lower pressure is more difficult and the plasma density may fall. In the illustrated embodiment, the shield 308 has an axial length of 7.6 cm but may range from 6-10 cm in a preferred embodiment.

Referring again to FIG. 5, a gas source 364 supplies a sputtering working gas, such as, for example, the chemically inactive noble gas argon, to the chamber 301 through a mass flow controller 366. The working gas can be admitted to the top of the chamber or, as illustrated, at its bottom, either with one or more inlet pipes penetrating apertures through the bottom of the shield chamber shield 309 or through a gap between the chamber shield 309, the wafer chuck 312, and the pedestal 307.

A reactive PVD system may utilize nitrogen from a source 398 to form a nitride such as tantalum nitride or titanium nitride to be deposited as a film on the wafer. Another reactive PVD system may utilize oxygen from a source such as source 398 to form an oxide film for deposition. An examples of such an oxide film include silicon dioxide or hafnium silicon oxide films.

In another aspect of the present description, the reactor 300 also includes a gas box 420 to facilitate admitting other gasses from a source 422 or source 424. Methane is useful for forming a carbide film such as tantalum carbide or tantalum carbide nitride. However, methane and other gasses including toxic gasses may have additional handling protocols which may be appropriate, depending upon the characteristics of the gas.

For example, the gas box 420 of the illustrated embodiment includes an interlock which monitors the chamber pressure and if the chamber pressure exceeds a predetermined maximum, such as 500 Torr, for example, an alarm may be triggered and a safety valve may close, cutting off the source 422, 424 from the chamber 301. In addition, the gas box 420 has a pressure differential switch which monitors the pressure difference between the interior pressure of the gas box 420 and the exterior pressure. If the pressure differential exceeds a predetermined maximum, an alarm may be triggered and a safety valve may close, cutting off the source 422, 424 from the gas box 420.

In yet another aspect of the gas box 420, the internal gas lines of the gas box 420 may be purged with a suitable purge gas such as nitrogen. Accordingly, should disassembly of the gas box be appropriate to service or replace a part, any toxic or gasses presenting special safety issues may be purged prior to disassembly of the gas box. Purging may also be appropriate where one gas box 420 is used with multiple incompatible gasses from multiple sources 422, 424.

The vacuum pumping system 148 may be connected to the chamber 301 through a wide pumping port 372 to maintain the chamber at a low pressure. In accordance with another aspect of the present description, for those PVD chambers which may utilize gasses such as toxic gasses or other gasses having additional handling protocols, a combination pump 108 which includes a cryogenic pump 432 and a turbomolecular pump 434, has an inlet coupled to the pumping port 372. The turbo/cryo pump 108 may be used in addition to or instead of the vacuum pumping system 148. In the illustrated embodiment, the cryogenic pump has a single stage adapted to absorb water vapor for example, but lacks a second stage which would typically absorb additional gasses such as oxygen or methane. Absorption of certain gasses may not be in accordance with the handling protocols for those particular gasses. Rather than absorbing the gasses in a second stage of cryogenic pump, these additional gasses may be pumped away by the turbomolecular pump 434. It is appreciated that the pump 108 may be used to achieve an ultra high vacuum and is flexible enough to pump a variety of gases and vapors including, for example, $O_2$, $N_2$, Ar, $CH_4$, $H_2$, etc.

Although the base pressure can be held to about $10^{-7}$ Torr or even lower, the pressure of the working gas is typically maintained between about 1 and 20 milliTorr in conventional sputtering in which SIP sputtering is reduced or eliminated. For those applications utilizing SIP sputtering a pressure below about 5 milliTorr, for example, may be used. The computer-based controller 150 controls the reactor including the DC target power supply 314.

To provide efficient sputtering, the magnetron 305 is positioned in back of the target 303. It has opposed magnets 374a, 374b connected and supported by a magnetic yoke 386. The magnets create a magnetic field adjacent the magnetron 305 within the chamber 301. The magnetic field traps electrons and, for charge neutrality, the ion density also increases to form a high-density plasma region 388. The magnetron 305 is usually rotated about the center axis 390 of the target 303 by a motor-driven shaft 392 to achieve full coverage in sputtering of the target 303.

When the argon is admitted into the chamber, the DC voltage difference between the target 303 and the chamber shield 309 ignites the argon into a plasma, and the positively charged argon ions are attracted to the negatively charged target 303. The ions strike the target 303 at a substantial energy and cause target atoms or atomic clusters to be sputtered from the target 303. Some of the target particles strike the wafer 304 and are thereby deposited on it, thereby forming a film of the target material. In reactive sputtering of a metallic nitride, nitrogen is additionally admitted into the chamber from a source 398, and it reacts with the sputtered metallic atoms to form a metallic nitride on the wafer 304.

In operation, a gate valve operatively coupled to the exhaust outlet 372 is fully opened in order to achieve the desired vacuum level of about $1 \times 10^{-8}$ Torr in the deposition chamber 301 prior to introduction of the process gas(es) into the chamber. To commence processing within the sputtering chamber 301, argon or other process gasses are flowed into the sputtering chamber 301 via a gas inlet 396. After the gas stabilizes at a pressure of about 0.1-40 milliTorr (preferably 1-5 milliTorr), power is applied to the target 303 via the power supply 314. The gas mixture continues to flow into the sputtering chamber 301 via the gas inlet 396 and is pumped there from via the pump 370 to maintain gas pressure in the chamber. The power applied to the target 303 causes the gas to form plasma and to generate ions such as argon ions which are attracted to and strike the target 303, causing target material (e.g., cobalt or nickel) to be ejected there from. The ejected target material travels to and deposits on the wafer 304 supported by the pedestal 307.

In one example of the description provided herein, a gate stack which includes both an insulation layer and a metal gate electrode layer is formed on a substrate. It is appreciated that other types of stacks of metal layers, insulative layers, and conductive layers, in various combinations may be fabricated as well, depending upon the particular application. For example, full silicidation of polysilicon gates, otherwise known as FUSI, may be combined with a deposited metal layer as nickel or cobalt, for example, to form a metal-silicide gate such as a nickel-silicide gate.

Another example of an application is Magnetoresistive Random Access Memory (MRAM) which functions by changing the spin of electrons in thin film layers of magnetic material. Typical MRAM materials are: NiFe, NiFeCo, CoFe, Co, Cu, Ta, Ti, Zr, Au, Ru, Cr, CoPt, CoCrPt, $Al_2O_3$, $SiO_2$, FeNi, FeTa, FeTaCr, FeAl, FeZr, NiFeCr, NiFeX. Antiferromagnetic materials are: FeMn, MnNi, MnPt, Mnlr, and MnPdPt. One example of an MRAM stack is a silicon substrate on which is deposited a Ta buffer seed layer, on which is deposited a 120 angstrom MnPt pinning layer, on which is deposited an 18 angstrom CoFe pinned magnetic layer, on which is deposited an 8 angstrom Ru pin enhance layer, on which is deposited a 28 angstrom CoFe pinned magnetic layer, on which is deposited a 7 angstrom Al2O3 tunnel junction layer, on which is deposited a 15 angstrom CoFe free magnetic layer, on which is deposited a 25 angstrom NiFe free magnetic layer, on which is deposited a Ta cap protection layer. Some or all of these layers may be deposited in accordance with the description provided herein. Other layers which may be deposited in accordance with the description provided herein include liner, barrier, adhesion, seed or nucleation layers.

It will, of course, be understood that modifications of the present invention, in its various aspects, will be apparent to those skilled in the art, some being apparent only after study, others being matters of routine mechanical and process design. Other embodiments are also possible, their specific designs depending upon the particular application. As such, the scope of the invention should not be limited by the particular embodiments herein described but should be defined only by the appended claims and equivalents thereof.

What is claimed is:

1. A method, comprising:
    depositing at least one insulative layer on a substrate in a first deposition chamber coupled to a robot chamber of a mainframe of a platform;
    transferring said substrate through a robot chamber of said mainframe to a second deposition chamber coupled to a robot chamber of said mainframe;
    maintaining at a vacuum pressure each robot chamber of said mainframe through which said substrate is transferred as said substrate is transferred from said first deposition chamber to a metal deposition chamber of said platform; and
    depositing at least one metal conductive layer on said insulative layer in a metal deposition chamber of said platform wherein said metal conductive layer depositing includes sputtering a target of a conductive metal in said second chamber.

2. The method of claim 1 wherein said insulative layer depositing includes depositing a plurality of insulative layers and said metal conductive layer depositing includes depositing a plurality of metal conductive layers on said insulative layer.

3. The method of claim 1 wherein said insulative layer depositing includes providing a chemical vapor into said first chamber and depositing a chemical onto said substrate from said chemical vapor.

4. The method of claim 1 wherein said insulative layer depositing includes sputtering a target in said first chamber and introducing a reactive gas into said chamber to chemically react with said sputtered target material to form a deposition material for deposition on said substrate.

5. The method of claim 1 wherein said metal conductive layer depositing includes depositing a metal film using a atomic layer deposition chamber as said second deposition chamber.

6. The method of claim 1 wherein said metal conductive layer depositing includes depositing a metal film using a chemical vapor deposition chamber as said second chamber.

7. The method of claim 1 wherein said metal conductive layer depositing includes depositing a protective metal conductive layer on said insulative layer at a first deposition rate and a bulk metal conductive layer on said protective metal conductive layer at a second deposition rate greater than said first deposition rate and wherein said protective metal conductive layer is thinner than said bulk metal conductive layer.

8. The method of claim 7 wherein said protective layer is deposited at a first pressure and said bulk layer is deposited at a second pressure lower than said first pressure.

9. The method of claim 7 wherein said protective layer is deposited using an atomic layer deposition chamber in said second chamber.

10. The method of claim 9 further comprising transferring said substrate through a robot chamber of said mainframe to a third deposition chamber coupled to a robot chamber of said mainframe wherein said bulk layer is deposited using a physical vapor deposition chamber as said third deposition chamber; and maintaining at a vacuum pressure each robot chamber of said mainframe through which said substrate is transferred as said substrate is transferred from said second deposition chamber to said third deposition chamber.

11. The method of claim 7 wherein said protective layer provides at least one of providing enhanced adhesion between said insulative layer and said bulk layer, providing diffusion barrier between said insulative layer and said bulk layer, and modulating the work function of said bulk layer.

12. The method of claim 1 wherein said insulative layer and metal conductive layer are part of a gate stack.

13. The method of claim 1 further excluding cleaning the insulative layer prior to depositing the metal conductive layer on said insulative layer.

14. The method of claim 1 wherein said first deposition chamber is a physical vapor deposition chamber having a target and wherein said insulative layer depositing includes pulsing said target with negative voltage pulses alternating with positive voltage pulses.

15. The method of claim 1 further comprising absorbing water vapor from said second chamber using a cryogenic pump as one stage of a combination pump and pumping other gasses including toxic gasses from said second chamber using a turbomolecular pump as another stage of said combination pump.

16. The method of claim 1 further comprising supplying gasses to said second chamber using a gas box and purging gasses from gas lines of said gas box using a purge gas.

17. The method of claim 1 further comprising transferring said substrate through a robot chamber of said mainframe to a preclean chamber coupled to a robot chamber of said mainframe; cleaning said substrate in-situ in said preclean chamber prior to said insulative layer deposition; transferring said substrate through a robot chamber of said mainframe from said preclean chamber to said first deposition chamber; and maintaining at a vacuum pressure each robot chamber of said mainframe through which said substrate is transferred as said substrate is transferred to said preclean chamber of said mainframe and as said substrate is transferred from said preclean chamber to said first deposition chamber.

18. The method of claim 17 wherein $NH_4F$ formed in a remote plasma is flown into the preclean chamber through showerheads and reaches the substrate surface, $NH_4F$ reacts with native oxide previously formed on a silicon substrate surface and forms $(NH_4)_2SiF_6$, which subsequently sublimates and leaves the substrate surface during an annealing process carried out in the same chamber.

19. The method of claim 1 further comprising annealing said substrate in-situ in said first deposition chamber following said insulative layer deposition.

20. The method of claim 1 further comprising transferring said substrate through a robot chamber of said mainframe from said first deposition chamber to a decoupled plasma nitridation (DPN) chamber coupled to a robot chamber of said mainframe; nitridating said insulative layer in said DPN chamber following said insulative layer deposition; transferring said substrate through a robot chamber of said mainframe from said DPN chamber to said second deposition chamber; and maintaining at a vacuum pressure each robot chamber of said mainframe through which said substrate is transferred as said substrate is transferred to said DPN chamber and as said substrate is transferred from said DPN chamber to said second deposition chamber.

21. The method of claim 20 further comprising annealing said substrate in-situ in said DPN chamber or a RTP chamber following said nitridating said insulative layer.

22. A method, comprising:
depositing at least one insulative layer on a substrate in a first deposition chamber coupled to a robot chamber of a mainframe of a platform;
transferring said substrate through a robot chamber of said mainframe to an atomic layer deposition chamber coupled to a robot chamber of said mainframe;
maintaining at a vacuum pressure each robot chamber of said mainframe through which said substrate is transferred as said substrate is transferred from a chamber to atomic layer deposition chamber of said mainframe;
depositing a protective metal conductive layer on an insulative layer in the atomic layer deposition chamber coupled to a robot chamber of said mainframe and
depositing a bulk metal conductive layer on said protective metal conductive layer in a physical vapor deposition chamber of said mainframe wherein said bulk metal conductive layer has a thickness greater than said protective metal conductive layer.

23. The method of claim 22 wherein said depositing a layer in an atomic layer deposition chamber includes pulsing a compound containing said metal.

24. The method of claim 22 wherein said protective metal conductive layer has a thickness of 30 angstroms or less.

25. The method of claim 22 wherein said bulk metal conductive layer depositing includes sputtering a target of a conductive metal in a physical vapor deposition chamber.

26. The method of claim 22 wherein said insulative layer, protective layer and bulk layer are part of a gate stack.

27. The method of claim 26 further comprising depositing a capping layer on said bulk layer.

* * * * *